United States Patent
Nakayama et al.

(10) Patent No.: US 9,647,034 B2
(45) Date of Patent: May 9, 2017

(54) MAGNETORESISTIVE MEMORY DEVICE AND MANUFACTURING METHOD OF THE SAME

(71) Applicant: KABUSHIKI KAISHA TOSHIBA, Minato-ku, Tokyo (JP)

(72) Inventors: Masahiko Nakayama, Kawasaki Kanagawa (JP); Yutaka Hashimoto, Seoul (KR); Yasuyuki Sonoda, Seoul (KR); Tadashi Kai, Seoul (KR); Kenji Noma, Yokkaichi Mie (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 15/065,829

(22) Filed: Mar. 9, 2016

(65) Prior Publication Data
US 2017/0069687 A1    Mar. 9, 2017

Related U.S. Application Data

(60) Provisional application No. 62/216,189, filed on Sep. 9, 2015.

(51) Int. Cl.
| H01L 29/00 | (2006.01) |
| H01L 27/22 | (2006.01) |
| H01L 43/02 | (2006.01) |
| H01L 43/08 | (2006.01) |
| G11C 11/16 | (2006.01) |
| H01L 43/10 | (2006.01) |
| H01L 43/12 | (2006.01) |
| H01L 29/82 | (2006.01) |

(52) U.S. Cl.
CPC .......... *H01L 27/228* (2013.01); *G11C 11/161* (2013.01); *H01L 27/222* (2013.01); *H01L 29/82* (2013.01); *H01L 43/02* (2013.01); *H01L 43/08* (2013.01); *H01L 43/10* (2013.01); *H01L 43/12* (2013.01)

(58) Field of Classification Search
CPC ........ H01L 43/08; H01L 27/222; H01L 29/82
See application file for complete search history.

(56) References Cited

U.S. PATENT DOCUMENTS

| 8,634,238 B2 | 1/2014 | Nakayama et al. | |
| 2007/0096229 A1* | 5/2007 | Yoshikawa | G11C 11/16 257/421 |
| 2010/0109109 A1* | 5/2010 | Chen | H01L 43/08 257/421 |
| 2011/0163400 A1* | 7/2011 | Ono | B82Y 25/00 257/421 |

(Continued)

*Primary Examiner* — Ngan Ngo
(74) *Attorney, Agent, or Firm* — Holtz, Holtz & Volek PC (57) ABSTRACT

According to one embodiment, a magnetoresistive memory device includes a stacked layer structure includes a first magnetic layer, a second magnetic layer, and a nonmagnetic layer between the first magnetic layer and the second magnetic layer, and a third magnetic layer provided on the first magnetic layer, which is opposite the nonmagnetic layer. The third magnetic layer includes a first magnetic material portion and a second magnetic material portion provided between the stacked layer structure and the first magnetic material portion. The saturation magnetization of the second magnetic material portion is smaller than that of the first magnetic material portion.

20 Claims, 6 Drawing Sheets

(56) References Cited

U.S. PATENT DOCUMENTS

| | | | |
|---|---|---|---|
| 2012/0088125 A1* | 4/2012 | Nishiyama | B82Y 25/00 428/828 |
| 2012/0281463 A1* | 11/2012 | Honjou | G11C 11/16 365/158 |
| 2012/0300542 A1* | 11/2012 | Uchida | G11C 11/161 365/171 |
| 2013/0099338 A1 | 4/2013 | Nakayama et al. | |
| 2013/0175646 A1* | 7/2013 | Kim | G11C 11/161 257/421 |
| 2014/0119109 A1* | 5/2014 | Nagase | H01L 43/08 365/158 |
| 2014/0252515 A1* | 9/2014 | Lai | H01L 43/12 257/421 |
| 2015/0255134 A1* | 9/2015 | Uchida | H01L 43/08 257/421 |
| 2016/0365508 A1* | 12/2016 | Saida | H01L 43/08 |
| 2016/0365509 A1* | 12/2016 | Saida | H01L 43/10 |

* cited by examiner

MAGNETORESISTIVE MEMORY DEVICE AND MANUFACTURING METHOD OF THE SAME

CROSS-REFERENCE TO RELATED APPLICATIONS

This application claims the benefit of U.S. Provisional Application No. 62/216,189, filed Sep. 9, 2015, the entire contents of which are incorporated herein by reference.

FIELD

Embodiments described herein relate generally to a magnetoresistive memory device and a manufacturing method of the same.

BACKGROUND

Nowadays, a large-capacity magnetoresistive random access memory (MRAM) which uses a magnetic tunnel junction (MTJ) element is expected and attracts people's attention. In an MTJ element, of two magnetic layers which sandwich a tunnel barrier layer, one of the magnetic layers is formed as a magnetization fixed layer (a reference layer) in which the direction of magnetization is fixed to be invariable, and the other magnetic layer is formed as a magnetization free layer (a storage layer) in which the direction of magnetization is made to be easily reversed. Further, a shift cancelling layer for suppressing the influence of a stray magnetic field may be provided.

DETAILED DESCRIPTION

In general, according to one embodiment, a magnetoresistive memory device comprises: a stacked layer structure includes a first magnetic layer, a second magnetic layer, and a nonmagnetic layer between the first magnetic layer and the second magnetic layer; and a third magnetic layer provided on the first magnetic layer, which is opposite the nonmagnetic layer, in which the third magnetic layer includes a first magnetic material portion and a second magnetic material portion provided between the stacked layer structure and the first magnetic material portion, and the saturation magnetization of the second magnetic material portion is smaller than that of the first magnetic material portion.

Hereinafter, the magnetoresistive memory device of the present embodiment will be described with reference to the drawings.

First Embodiment

Figure 1:
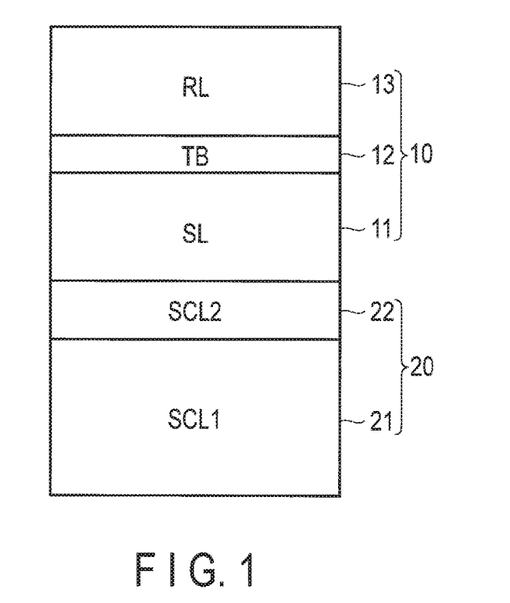
FIG. 1 is a cross-sectional view showing a basic structure of a magnetoresistive memory device according to a first embodiment.

FIG. 1 is a cross-sectional view showing a basic structure of a magnetoresistive memory device according to a first embodiment.

A magnetoresistive element (MTJ element) 10 is formed by a stacked layer structure in which a tunnel barrier layer (TB: nonmagnetic layer) 12 is sandwiched between a storage layer (SL: first magnetic layer) 11 for storing information and a reference layer (RL: second magnetic layer) 13. The storage layer 11 is formed of CoFeB, for example, and has a magnetic anisotropy which is perpendicular to a film surface, and the direction of magnetization is variable. The reference layer 13 is formed of CoFeB, for example, and has a magnetic anisotropy which is perpendicular to a film surface, and the direction of magnetization is fixed. The tunnel barrier layer 12 is formed of MgO, for example, and a tunnel current flows therethrough.

The magnetic layers which constitute the storage layer 11 and the reference layer 13 are not necessarily limited to CoFeB, and they may be any as long as the layer contains Co and Fe. Further, other ferromagnetic materials not limited to Co and Fe can be used. Moreover the reference layer 13 can be formed of magnetic material such as CoPt, CoNi or CoPd. Also, as the tunnel barrier layer 12, the material is not limited to MgO, and an oxide or a nitride containing at least one of Si, Ba, Ca, La, Mn, Zn, Hf, Ta, Ti, B, Cu, Cr, V, Mg, and Al can be used.

On the side of the storage layer 11 of the MTJ element 10, a shift cancelling layer (SCL: third magnetic layer) 20, which has a magnetic anisotropy perpendicular to a film surface and whose direction of magnetization is opposite to that of the reference layer 13, is provided. The shift cancelling layer 20 can be formed of magnetic material such as CoPt, CoNi or CoPd.

The shift cancelling layer 20 is for reducing a leakage magnetic field in the MTJ element 10, and is formed by stacking two or more magnetic material portions. More specifically, the shift cancelling layer 20 includes a first magnetic material portion (SCL1) 21, which is the layer farther from the MTJ element 10, and a second magnetic material portion (SCL2) 22, which is the layer closer to the MTJ element 10, and the saturation magnetization of the second magnetic material portion 22 is smaller than that of the first magnetic material portion 21. That is, the shift cancelling layer 20 has a structure including the first magnetic material portion 21 having large saturation magnetization, and the second magnetic material portion 22 which is provided between the MTJ element 10 and the first magnetic material portion 21, and has small saturation magnetization.

In mounting a device structure of FIG. 1 on a semiconductor substrate, a vertical positional relationship between the MTJ element 10 and the shift cancelling layer 20 is not limited, and either of the two may come at a lower position.

Figure 2A:
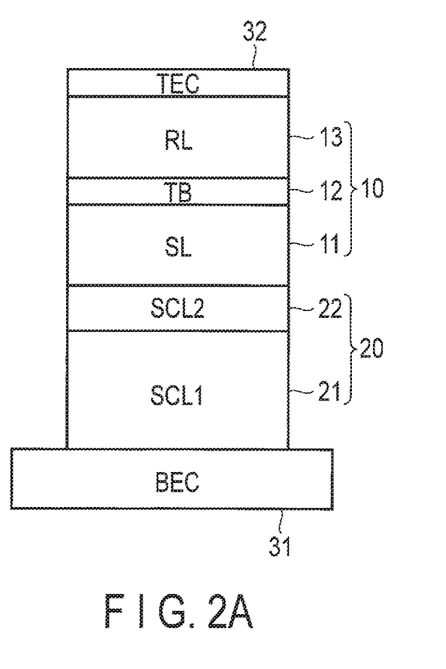
FIGS. 2A and 2B are cross-sectional views each showing an example in which an element structure of FIG. 1 is disposed between a bottom electrode and a top electrode.
Figure 2B:
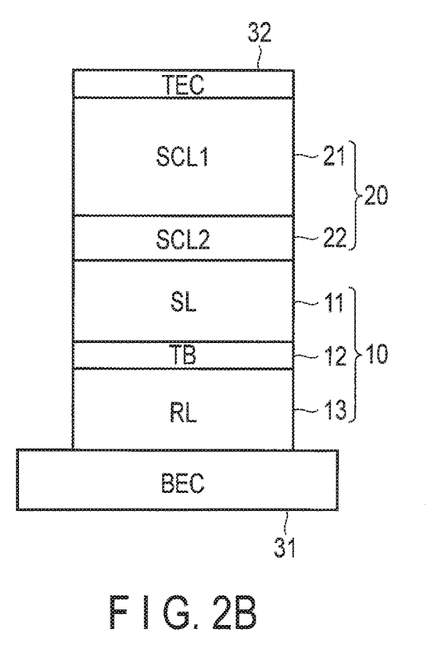

For example, as shown in FIG. 2A, the shift cancelling layer 20 may be formed on a bottom electrode (BEC) 31 on a semiconductor substrate (not shown), and a top electrode (TEC) 32 may be formed on the MTJ element 10. Conversely, as shown in FIG. 2B, the MTJ element 10 may be formed on the bottom electrode 31, and the top electrode 32 may be formed on the shift cancelling layer 20. For the bottom electrode 31 and the upper electrode, it is preferable to use W, Ta, Ti, TaN or TiN.

Figure 3:
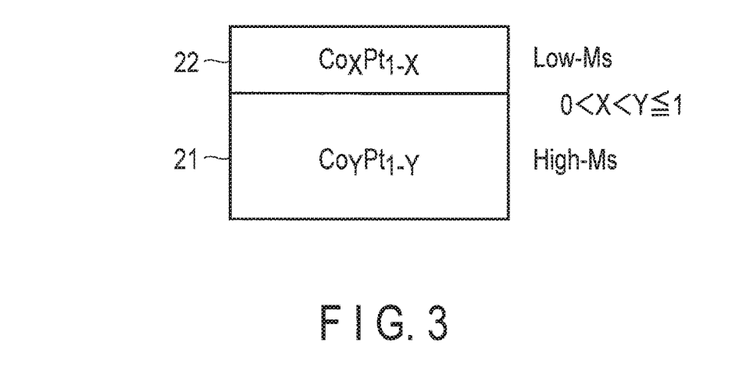
FIG. 3 is a cross-sectional view showing a specific configuration example of a shift cancelling layer used in the magnetoresistive memory device of the first embodiment.
Figure 4:
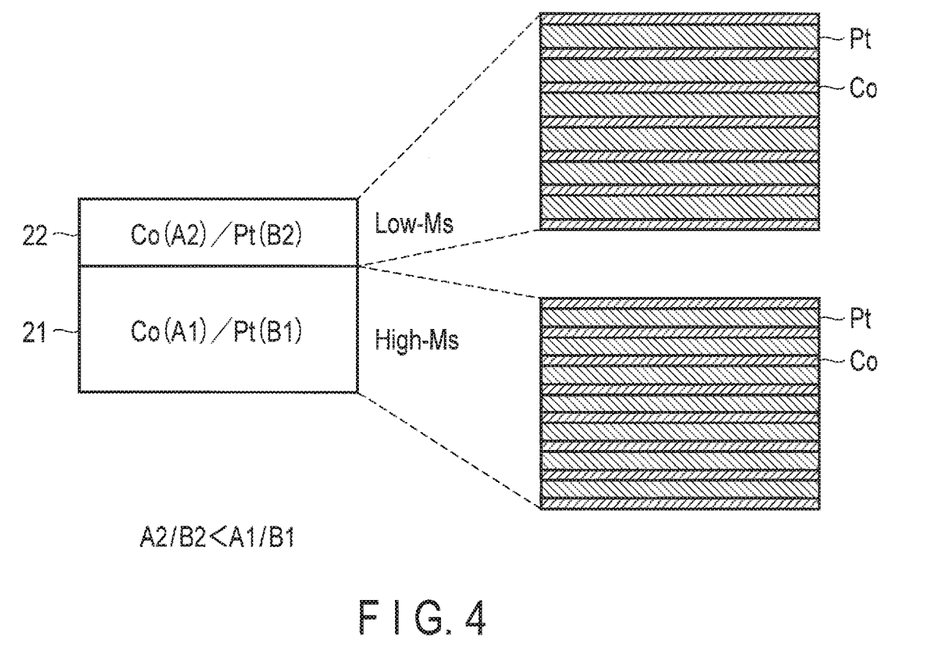
FIG. 4 is a cross-sectional view showing another specific configuration example of a shift cancelling layer used in the magnetoresistive memory device of the first embodiment.

FIGS. 3 and 4 are cross-sectional views each showing a specific configuration example of the shift cancelling layer 20.

In the example of FIG. 3, the shift cancelling layer 20 has a two-layer structure constituted of a $Co_xPt_{1-x}$ ($0<x<1$) alloy which forms the second magnetic material portion 22, and a $Co_yPt_{1-y}$ ($0<y\leq1$) which forms the first magnetic material portion 21. Here, in order to make the saturation magnetization of the second magnetic material portion 22 smaller than that of the first magnetic material portion 21, x is smaller than y ($x<y$).

That is, the first and the second magnetic material portions 21 and 22 are alloys containing a magnetic element, and the composition ratio of the magnetic element in the second magnetic material portion 22 (the ratio of the magnetic element to the whole elements [atom %]) is less than the composition ratio of the magnetic element in the first magnetic material portion 21. The magnetic element included in magnetic material portions 21 and 22 is not limited to Co, and Fe, Ni, Mn, or a rare-earth element can be used.

The Co composition of magnetic material portion 22 is preferably 10 to 50% in order to reduce the saturation magnetization while maintaining sufficient perpendicular magnetic anisotropy. However, even if the Co composition of magnetic material portion 22 is outside the above range of composition, if the Co composition is less than that of magnetic material portion 21, the advantage of being able to reduce horizontal magnetic field Hx in the storage layer 11 can be obtained.

In the example of FIG. 4, each of magnetic material portions 21 and 22 which constitute the shift cancelling layer 20 has an artificial lattice structure of Co and Pt. That is, the first magnetic material portion 21 is an artificial lattice structure in which Co having thickness A1 [angstroms] and Pt having thickness B1 [angstroms] are alternately stacked, and the second magnetic material portion 22 is an artificial lattice structure in which Co having thickness A2 [angstroms] and Pt having thickness B2 [angstroms] are alternately stacked. Here, the ratio of the film thickness of Co to Pt (Co/Pt) of the second magnetic material portion 22 is less than that of the first magnetic material portion 21. More specifically, the ratio of the film thickness of Co to Pt (A2/B2) of the second magnetic material portion 22 is less than the ratio of the film thickness of Co to Pt (A1/B1) of the first magnetic material portion 21.

That is, the first and the second magnetic material portions 21 and 22 include a magnetic element, and the content of the magnetic element in the second magnetic material portion 22 is less than the content of the magnetic element in the first magnetic material portion 21. The magnetic element included in magnetic material portions 21 and 22 is not limited to Co, and Fe, Ni, Mn, or a rare-earth element can be used.

The ratio of the Co film thickness (A2/B2) of magnetic material portion 22 is preferably 0.1 to 0.5 in order to reduce the saturation magnetization while maintaining sufficient perpendicular magnetic anisotropy. However, even if the ratio of the Co film thickness (A2/B2) of magnetic material portion 22 is outside the above range of the film thickness ratio, if it is less than the Co film thickness ratio (A1/B1) of magnetic material portion 21, the advantage of being able to reduce horizontal magnetic field Hx in the storage layer 11 can be obtained.

Note that as magnetic material portions 21 and 22, they are not limited to CoPt or an artificial lattice structure of Co and Pt, and the following materials can be used.

Co-based alloy: CoPt, CoPd, CoPt—X (typically, X may be Cr or Fe), and an artificial lattice system.

Fe-based alloy: FePt, FePd, FePt—X (typically, X may be Cr or Fe), and an artificial lattice system.

Tb-based alloy: CoX, CoFe—X (typically, X may be Tb, Dy, Gd, Ho, Nd).

Mn-based alloy: MnX (typically, X is Al, etc).

Further, in the case of the composition of Co-based alloy and Fe-based alloy, the first magnetic material portion and the second magnetic material portion may be determined based on a comparison between the composition ratio of a total of Co and Fe and the composition ratio of the other materials. Further, as regards the Tb-based alloy, based on a comparison between the composition ratio of a total of Co and Fe and the composition ratio of Tb, the first magnetic material portion and the second magnetic material portion may be determined.

Next, the advantage obtained by structuring the shift cancelling layer 20 (SCL) as two layers, and reducing the saturation magnetization on the side of the MTJ element 10 will now be described.

Figure 5A:
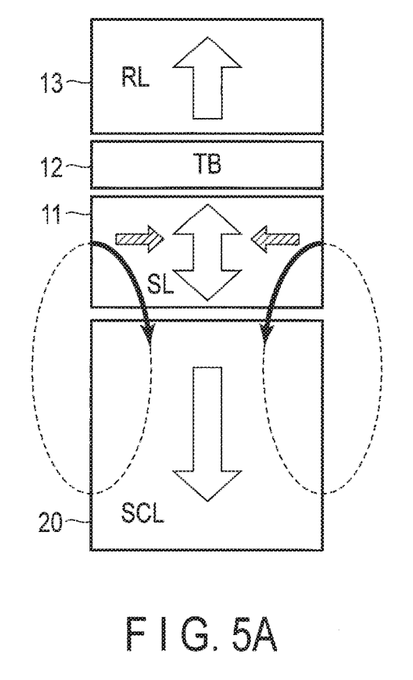
FIGS. 5A and 5B are schematic views for describing a difference between a conventional example and the first embodiment.

As shown in FIG. 5A, when the shift cancelling layer 20 is arranged on the side of the storage layer 11, a magnetic field in the x-direction produced by the reference layer 13 and a magnetic field in the x-direction produced by the shift cancelling layer 20 are in the same direction at a portion of the storage layer 11. Accordingly, a magnetic field component in the x-direction in the storage layer 11, that is, horizontal magnetic field Hx, is increased. If Hx is increased, the write efficiency and data retention capability are degraded.

Figure 5B:
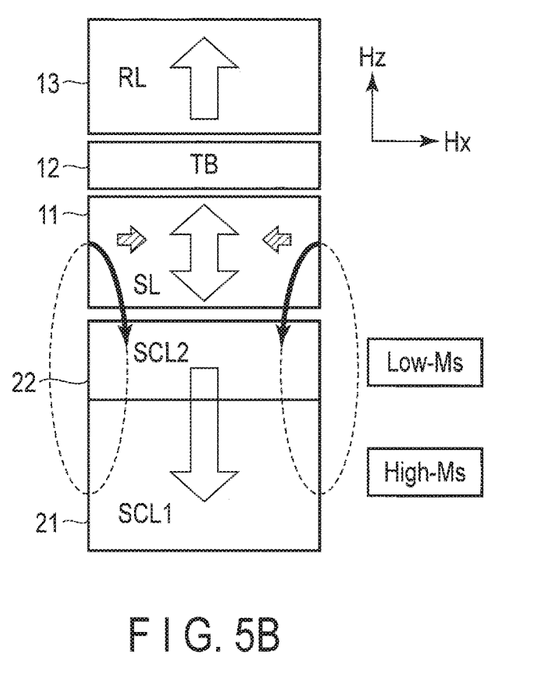

In contrast, in the present embodiment, as shown in FIG. 5B, the shift cancelling layer 20 is formed as two layers, and the saturation magnetization of the second magnetic material portion 22, which is the layer closer to the MTJ element 10, is made smaller than the saturation magnetization of the first magnetic material portion 21, which is the layer farther from the MTJ element 10. With such a structure, as shown by a broken line in the drawing, a magnetic field produced by the shift cancelling layer 20 becomes steep in the z-direction, and as a result, horizontal magnetic field Hx is reduced. That is, the oblateness of an elliptical magnetic field produced by the shift cancelling layer 20 is reduced, and as a consequence, Hx is reduced.

A corner portion (edge portion) of the shift cancelling layer 20 also affects Hx being reduced. That is, since the magnetic field is largely affected by the corner portion, if the saturation magnetization of the corner portion is large, magnetic field component Hx in the x-direction is also increased. If the saturation magnetization of the corner portion is small, Hx is also small. For these reasons, as in the present embodiment, by forming the shift cancelling layer 20 to have two layers, which are the first magnetic material portion 21 and the second magnetic material portion 22, and making the saturation magnetization of the second magnetic material portion 22 smaller than that of the first magnetic material portion 21, horizontal magnetic field Hx can be reduced.

Figure 6:
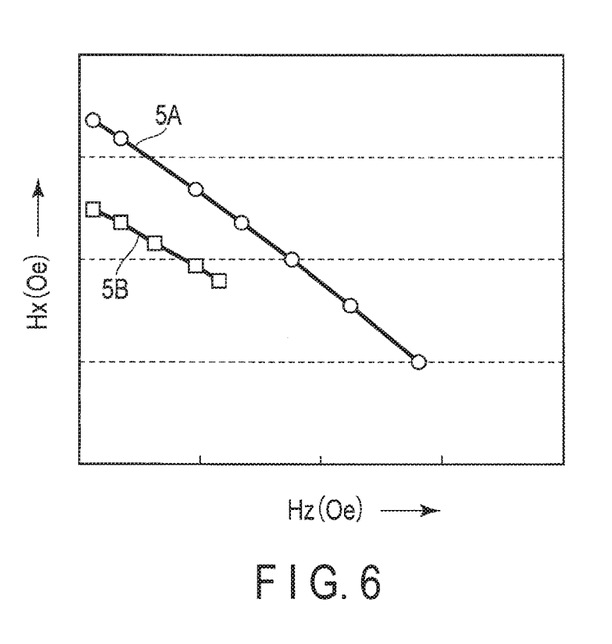
FIG. 6 is a characteristic diagram showing the relationship between a shift magnetic field and a horizontal magnetic field, which is presented to describe the advantage obtained by the first embodiment.

FIG. 6 shows the relationship between shift magnetic field Hz and horizontal magnetic field Hx. 5A in the figure shows the case of a conventional structure of FIGS. 5A, and 5B of the same shows the case of the structure of the embodiment of FIG. 5B. With the structure of the present embodiment, since horizontal magnetic field Hx with respect to the same shift magnetic field Hz is smaller, horizontal magnetic field Hx for nullifying shift magnetic field Hz can be reduced.

Further, when the shift cancelling layer 20 is arranged on the side of the reference layer 13, since a magnetic field in the x-direction produced by the reference layer 13 and a magnetic field in the x-direction produced by the shift cancelling layer 20 are in the opposite directions, magnetic field component Hx in the x-direction in the storage layer 11 is reduced. However, when the size of the MTJ element 10 is small, shift magnetic field Hz is increased, and stable data retention cannot be carried out. Accordingly, as in the present embodiment, arranging the shift cancelling layer 20 on the side of the storage layer 11, and making the saturation magnetization of the second magnetic material portion 22, which is the layer closer to the storage layer 11, smaller than the saturation magnetization of the first magnetic material portion 21, which is the layer farther from the storage layer 11, are extremely effective.

As can be seen, according to the present embodiment, by arranging the shift cancelling layer 20 on the side of the storage layer 11 of the MTJ element 10, and forming the shift cancelling layer 20 with two layers, i.e., the second magnetic material portion 22 which is on the side of the MTJ element 10 and has smaller saturation magnetization, and the first magnetic material portion 21 which is on the side opposite to the MTJ element 10 and has larger saturation magnetization, it is possible to reduce horizontal magnetic field Hx while reducing shift magnetic field Hz. Consequently, the write efficiency and the data retention characteristics of the MTJ element 10 can be improved.

It should be noted here that in the MTJ element configured to sandwich a tunnel barrier layer between a storage layer and a reference layer, the so-called shift magnetic field Hz (Hshift) that a magnetic field necessary for reversing the magnetization of the storage layer shifts by the influence of a stray magnetic field from the reference layer occurs. In order to cancel or reduce the shift magnetic field, generally, a shift cancelling layer is disposed on the side of the reference layer.

If the size of the MTJ element is reduced in this structure, the influence of a stray magnetic field from the reference layer is increased, and the shift magnetic field cannot be reduced sufficiently. If the shift cancelling layer is formed thick in order to sufficiently reduce the shift magnetic field, grain sizes in the in-plane direction of the shift cancelling layer become nonuniform, and a variation is exhibited in perpendicularity when the element is formed.

Hence, a study has been made to arrange the shift cancelling layer on the side of the storage layer, not on the side of the reference layer. However, if the shift cancelling layer is disposed on the storage layer side, horizontal magnetic field Hx in the storage layer is increased. When Hx is increased, not only the retentive power in the storage layer is reduced, but a current for writing in the storage layer is also increased. That is, this leads to reduction of the write efficiency or degradation of the data holding characteristics.

In the present embodiment, the shift cancelling layer is formed of two layers, namely, the first magnetic material portion 21 which has high saturation magnetization and the second magnetic material portion 22 which has low saturation magnetization, in order to resolve the above-described problem.

Second Embodiment

Figure 7A:
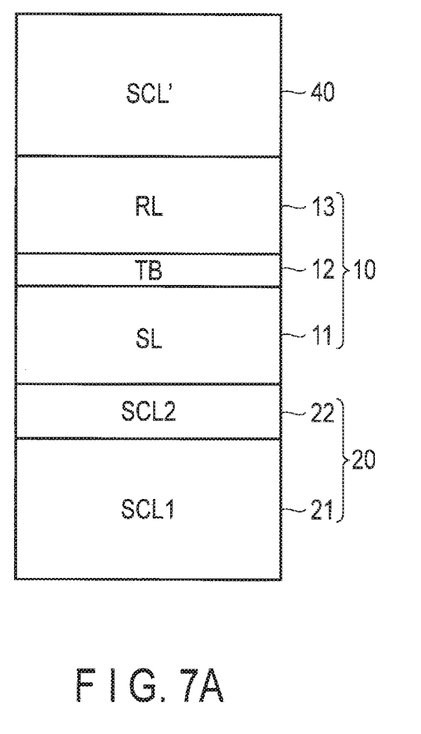
FIGS. 7A and 7B are cross-sectional views each showing a basic structure of a magnetoresistive memory device according to a second embodiment.
Figure 7B:
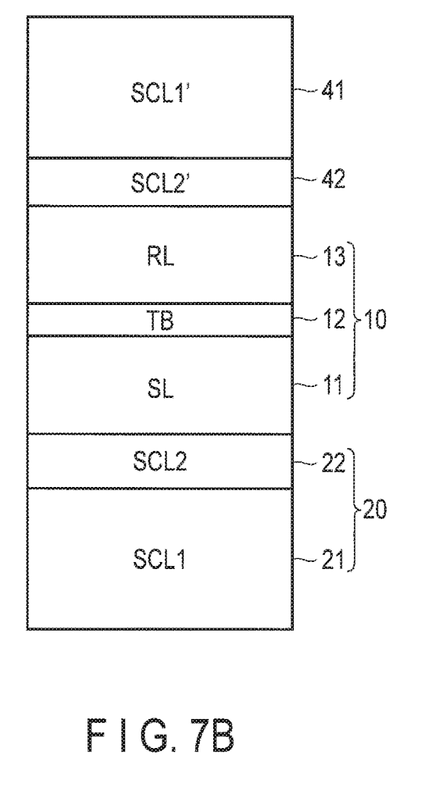

FIGS. 7A and 7B are cross-sectional views each showing a basic structure of a magnetoresistive memory device according to a second embodiment. It should be noted that the same portions as those of FIG. 1 will be given the same reference numbers, and detailed explanations of them will be omitted.

The point in which the present embodiment is different from the first embodiment described above is that in addition to arranging a shift cancelling layer 20 on the side of a storage layer 11 of an MTJ element 10, an auxiliary shift cancelling layer 40 is arranged on the side of a reference layer 13.

In the example of FIG. 7A, the auxiliary shift cancelling layer (SCL') 40 is formed on the reference layer 13. The auxiliary shift cancelling layer 40 assists the shift-cancellation effect obtained by the shift cancelling layer 20, and may be formed of an alloy of Co and Pt or an artificial lattice structure of Co and Pt as described in the first embodiment above. Further, since the main shift cancelling is carried out by the shift cancelling layer 20, the auxiliary shift cancelling layer 40 does not need to be formed so thick. Accordingly, arranging the auxiliary shift cancelling layer 40 does not cause nonuniformity of grain sizes in the in-plane direction, or variation in perpendicularity when the element is formed.

Also, as shown in FIG. 7B, the auxiliary shift cancelling layer 40 may be a stacked layer structure in which a first magnetic material portion (SCL1') 41 and a second magnetic material portion (SCL2') 42 are stacked as in the first embodiment. Here, since the auxiliary shift cancelling layer 40 (41, 42) is sufficiently away from the storage layer 11, it is not necessarily required to make the saturation magnetization of the second magnetic material portion 42 smaller than that of the first magnetic material portion 41. In order to improve the shift-cancellation effect obtained by the auxiliary shift cancelling layer 40, the saturation magnetization of the second magnetic material portion 42 may be made larger than that of the first magnetic material portion 41.

According to the present embodiment, in addition to the structure of the first embodiment, since the auxiliary shift cancelling layer 40 is provided on the side of the storage layer 13 of the MTJ element 10, not only is it possible to obtain an advantage similar to the advantage of the first embodiment, but a leakage magnetic field in the MTJ element 10 can further be reduced.

Third Embodiment

Next, an example in which the present embodiment is applied to an MRAM will be described.

Figure 8:
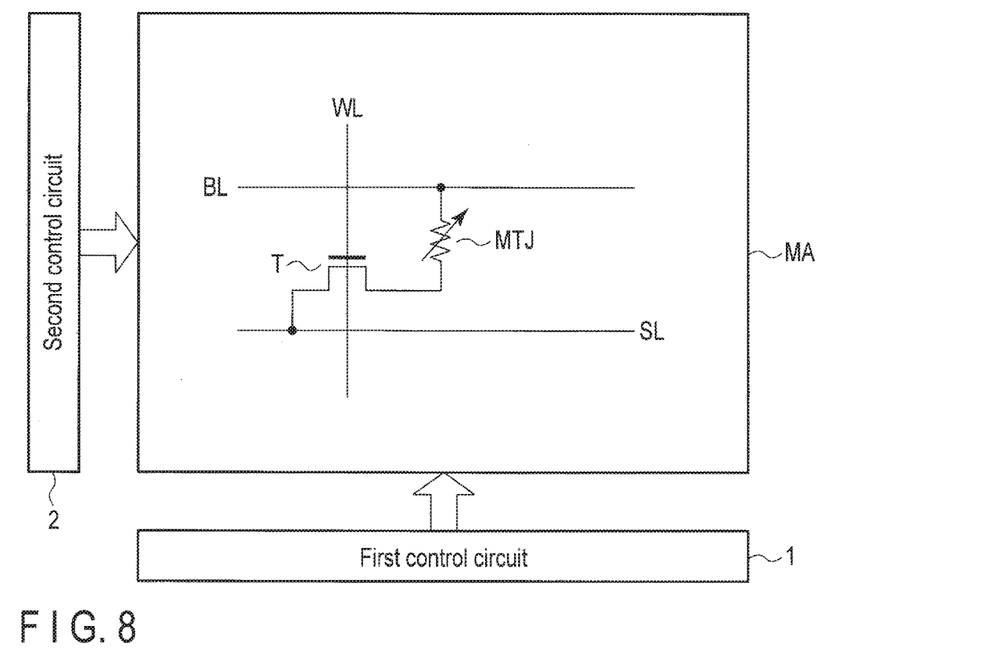
FIG. 8 is an equivalent circuit schematic showing a circuit configuration of a magnetoresistive memory device according to a third embodiment.

FIG. 8 is a circuit configuration diagram showing a memory cell array of an MRAM which uses a magnetoresistive element of the present embodiment.

A memory cell within a memory cell array MA comprises a series connection body including an MTJ element as a magnetoresistive element, and a select transistor for switching (for example, a field effect transistor [FET]) T. One end of the series connection body (one end of the MTJ element) is electrically connected to a bit line BL, and the other end of the series connection body (one end of the transistor T) is electrically connected to a source line SL.

A control terminal of the transistor T, for example, a gate electrode of the FET, is electrically connected to a word line WL. The potential of the word line WL is controlled by a first control circuit 1. Further, the potential of the bit line BL and the source line SL is controlled by a second control circuit 2.

Figure 9:
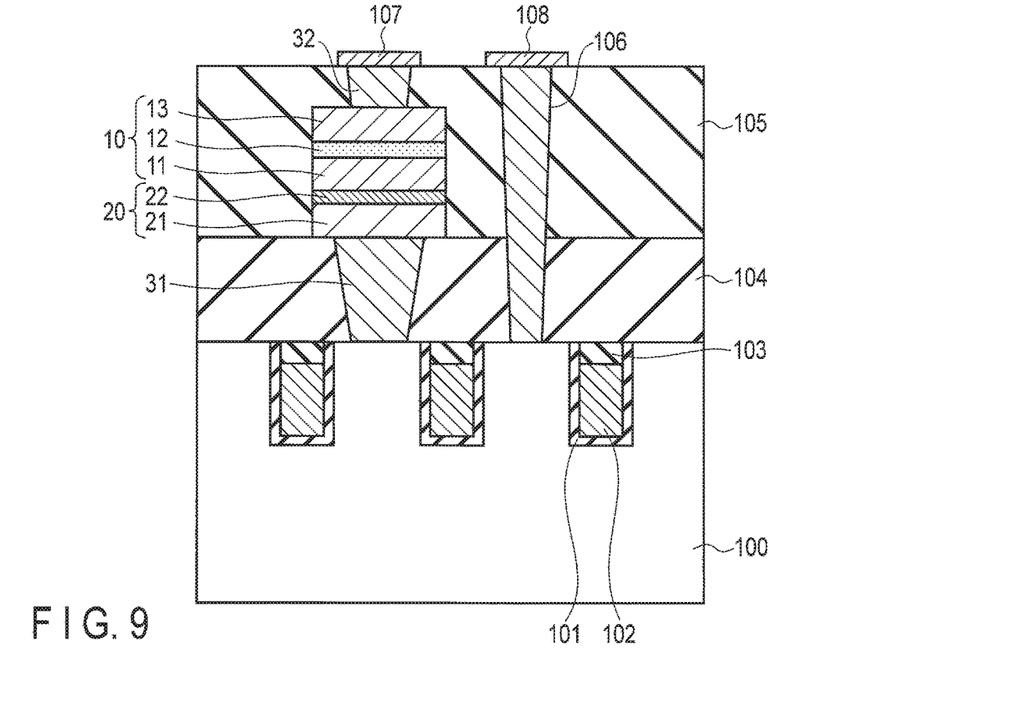
FIG. 9 is a cross-sectional view showing a schematic structure of the magnetoresistive memory device according to the third embodiment.

FIG. 9 is a cross-sectional view showing the structure of a memory cell portion which uses the magnetoresistive element according to the present embodiment.

On a surface portion of an Si substrate 100, a MOS transistor for switching is formed, and an interlayer insulating film 104 is formed on the MOS transistor for switching. The transistor has a buried gate structure formed by burying a gate electrode 102 in a groove provided in the substrate 100 via a gate insulating film 101. The gate electrode 102 is buried halfway in the groove, and a protective insulating film 103 is formed on the gate electrode 102. Also, although not illustrated in the drawing, source/drain regions are formed on both sides of the buried gate structure by diffusing a p- or n-type impurity in the substrate 100.

Note that the structure of a transistor portion is not limited to one having a buried gate structure. For example, a structure in which a gate electrode is formed on the surface of the Si substrate 100 via a gate insulating film may alternatively be employed. The structure of the transistor portion could be any as long as it functions as a switching element.

A contact hole for connection with the drain of the transistor is formed in interlayer insulating film 104, and a bottom electrode (BEC) 31 is formed to be buried in this contact hole. The bottom electrode 31 is made of a metal having crystallinity, which is Ta, for example. The material of the bottom electrode is not limited to Ta, and it is sufficient if the material is one which can be satisfactorily buried in the contact hole and has sufficient conductivity. That is, W, TiN, and Cu, other than Ta, can be used.

On the bottom electrode 31, first and second magnetic material portions 21 and 22 for forming a shift cancelling layer (a third magnetic layer) 20 described in the above embodiment are formed. On the second magnetic material portion 22, a storage layer (a first magnetic layer) 11, a tunnel barrier layer (a nonmagnetic layer) 12, and a reference layer (a second magnetic layer) 13 are formed for forming an MTJ element 10 described in the above embodiment.

On a substrate on which the MTJ element 10 is formed, an interlayer insulating film 105 is formed. In the interlayer insulating film 105, a top electrode (contact plug: TEC) 32 which is connected to the reference layer 13 of the MTJ element 10 is formed by burying. Also, a contact plug 106 which is connected to the source of the transistor portion is formed by burying penetrating through interlayer insulating film 105 and interlayer insulating film 104. Further, on interlayer insulating film 105, interconnect (BL) 107 which is connected to contact plug 32, and interconnect (SL) 108 which is connected to contact plug 106 are formed.

Next, a method of manufacturing the memory cell portion of the present embodiment will be described with reference to FIGS. 10A to 10C.

Figure 10A:
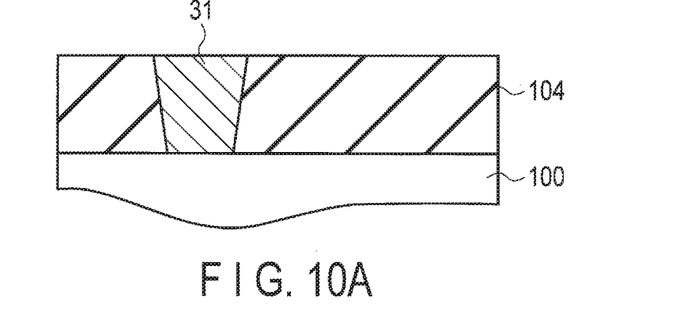
FIGS. 10A to 10C are cross-sectional views showing manufacturing steps of the magnetoresistive memory device according to the third embodiment.

First, as shown in FIG. 10A, after forming a MOS transistor for switching (not shown) having the buried gate structure on the surface portion of the Si substrate 100, interlayer insulating film 104 of $SiO_2$, etc., is deposited on the Si substrate 100 by the CVD method. Next, after forming the contact hole for connection with the drain of the transistor in interlayer insulating film 104, the bottom electrode 31 constituted of crystalline Ta is formed by burying within the contact hole. More specifically, after depositing a Ta film on interlayer insulating film 104 by sputtering, etc., in such a way as to bury the contact hole, the Ta film on interlayer insulating film 104 is removed by chemical mechanical etching (CMP), thereby having the Ta film left only in the contact hole.

Figure 10B:
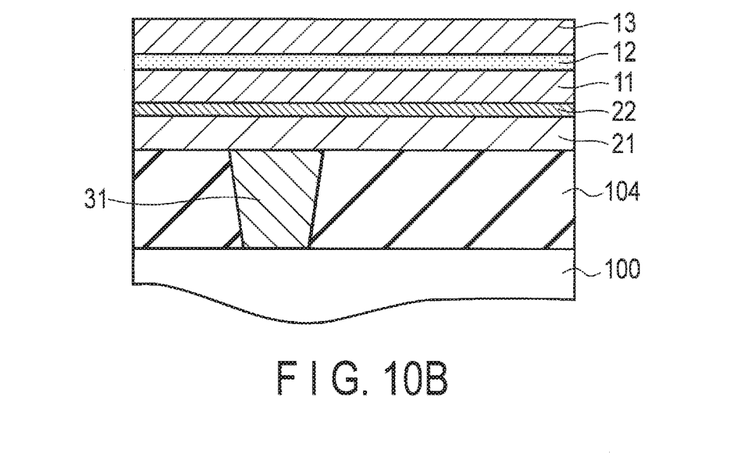

Next, as shown in FIG. 10B, the first and the second magnetic material portions 21 and 22 for forming the shift cancelling layer are formed on interlayer insulating film 104 and the lower electrode 31. More specifically, a CoPt alloy, for example, as the first magnetic material portion 21 is formed by sputtering, and a CoPt alloy as the second magnetic material portion 22 is formed by sputtering on top of that.

Here, although the composition of the first and second magnetic material portions 21 and 22 may be changed as appropriate, in order to make the saturation magnetization of the second magnetic material portion 22 smaller than that of the first magnetic material portion 21, the following may be carried out. That is, when the second magnetic material portion 22 is defined as $Co_xPt_{1-x}$, and the first magnetic material portion 21 is defined as $Co_yPt_{1-y}$, it is sufficient if the relationship is $0<x<y\le1$.

After that, on the second magnetic material portion 22, a CoFeB film which should serve as the storage layer 11 of the MTJ element 10, an MgO film which should serve as the tunnel barrier layer 12, and a CoFeB film which should serve as the reference layer 13 are formed.

Further, before forming the magnetic material portions, a buffer layer of Hf, for example, may be formed by sputtering. It is desirable that the buffer layer is a metal having good electrical conductivity. Also, in order to prevent diffusion toward the upper layer side of the MTJ element, an oxide film or a nitride film having electrical conductivity may be used.

Figure 10C:
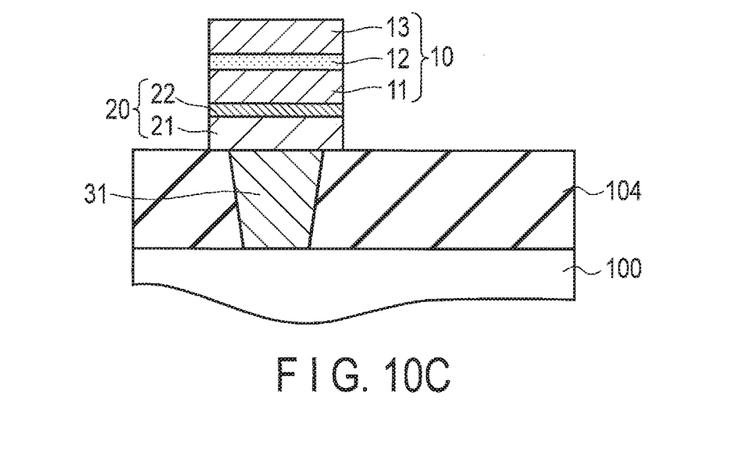

Next, as shown in FIG. 10C, by processing the above-mentioned laminated portion of 11, 12, 13, 21, and 22, in a cell pattern, the MTJ element 10 and the shift cancelling layer 20 are formed. More specifically, by forming a mask of a cell pattern on the CoFeB film as the reference layer 13, selective etching is performed by RIE, etc., such that the laminated portion remains like an island on the bottom electrode 31.

Subsequently, after forming the interlayer insulating film 105, contact plugs 32 and 106 are formed and interconnects 107 and 108 are further formed, so that the structure as shown in FIG. 9 can be obtained.

As described above, according to the present embodiment, by forming the MTJ element 10 on the substrate 100 having a select transistor, a memory cell portion of an MRAM can be formed. Further, by forming the shift cancelling layer 20 on the side of the storage layer 11 of the MTJ element 10, and further setting the saturation magnetization of the shift cancelling layer 20 such that the saturation magnetization of the portion closer to the MTJ element 10 is smaller than that of the farther portion, it is possible to reduce horizontal magnetic field Hx while reducing shift magnetic field Hz. Accordingly, the write efficiency and data retention characteristics of the MTJ element 10 can be improved.

(Modification)

Note that the present invention is not necessarily limited to each of the above-described embodiments.

In the embodiments, in order to obtain a difference in the saturation magnetization of the shift cancelling layer, the composition of the magnetic element of the first and second magnetic material portions or the content of the magnetic element has been changed. However, the way to obtain the difference is not necessarily limited to the above. For example, a difference in the saturation magnetization may be obtained by a difference in the crystal structure of the first and second magnetic material portions.

Also, in the present embodiment, while the shift cancelling layer is formed as two layers, it may be formed as three or more layers. Also in this case, it is sufficient if the saturation magnetization of a portion closer to the MTJ element is made smaller than that of a farther portion. Further, the material of the shift cancelling layer may be one other than those described in the above embodiments as long as it can cancel or reduce the magnetic field that affects the storage layer. Furthermore, the material of other layers can be changed as appropriate according to the specification.

In addition, the structure of the transistor for switching or the bottom electrode is not in any limited to that described in the embodiments, and can be changed as appropriate according to the specification.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetoresistive memory device comprising:
a stacked layer structure includes a first magnetic layer, a second magnetic layer, and a nonmagnetic layer between the first magnetic layer and the second magnetic layer; and
a third magnetic layer provided on the first magnetic layer, which is opposite the nonmagnetic layer, the third magnetic layer including a first magnetic material portion and a second magnetic material portion provided between the stacked layer structure and the first magnetic material portion, saturation magnetization of the second magnetic material portion being smaller than that the first magnetic material portion.

2. The device of claim 1, wherein:
the nonmagnetic layer is a tunnel barrier layer through which a tunnel current flows;
the first magnetic layer is a storage layer having a magnetic anisotropy which is perpendicular to a film surface, and whose direction of magnetization is variable;
the second magnetic layer is a reference layer having a magnetic anisotropy which is perpendicular to a film surface, and whose direction of magnetization is fixed; and
the third magnetic layer is a shift cancelling layer having a magnetic anisotropy which is perpendicular to a film surface, and whose direction is opposite to that of the second magnetic layer.

3. The device of claim 1, further comprising a fourth magnetic layer provided on the second magnetic layer, which is opposite the nonmagnetic layer, and in which a direction of magnetization is opposite to that of the second magnetic layer.

4. The device of claim 1, further comprising a semiconductor substrate, a transistor for switching provided on the semiconductor substrate, and a bottom electrode connected to the transistor, wherein:
the third magnetic layer is provided on the bottom electrode; and
the stacked layer structure is provided on the third magnetic layer.

5. The device of claim 1, wherein the first and the second magnetic material portions include a same magnetic element.

6. The device of claim 5, wherein a composition ratio of the magnetic element in the second magnetic material portion is less than that of the magnetic element in the first magnetic material portion.

7. The device of claim 6, wherein the magnetic element is Co, Fe, Ni, or a rare-earth element.

8. The magnetoresistive memory device of claim 6, wherein the second magnetic material portion is $Co_xPt_{1-x}$ ($0<x<1$), and the first magnetic material portion is $Co_yPt_{1-y}$ ($x<y\leq1$).

9. The device of claim 5, wherein a content of the magnetic element in the second magnetic material portion is less than that of the magnetic element in the first magnetic material portion.

10. The device of claim 9, wherein the magnetic element is Co, Fe, Ni, Mn, or a rare-earth element.

11. The device of claim 9, wherein each of the first and the second magnetic material portions is an artificial lattice structure in which Co and Pt are alternately stacked, and a ratio of film thickness of Co to Pt (Co/Pt) is less in the second magnetic material portion than in the first magnetic material portion.

12. A magnetoresistive memory device comprising:
a stacked layer structure includes a first magnetic layer, a second magnetic layer, and a nonmagnetic layer between the first magnetic layer and the second magnetic layer; and
a third magnetic layer provided on the first magnetic layer, which is opposite the nonmagnetic layer, the third magnetic layer including a first magnetic material portion and a second magnetic material portion provided between the stacked layer structure and the first magnetic material portion, a content of a magnetic element in the second magnetic material portion being less than that of a magnetic material portion in the first magnetic material portion.

13. The device of claim 12, wherein:
the nonmagnetic layer is a tunnel barrier layer through which a tunnel current flows;
the first magnetic layer is a storage layer having a magnetic anisotropy which is perpendicular to a film surface, and whose direction of magnetization is variable;
the second magnetic layer is a reference layer having a magnetic anisotropy which is perpendicular to a film surface, and whose direction of magnetization is fixed; and
the third magnetic layer is a shift cancelling layer having a magnetic anisotropy which is perpendicular to a film surface, and whose direction is opposite to that of the second magnetic layer.

14. The device of claim 12, further comprising a fourth magnetic layer provided on the second magnetic layer, which is opposite the nonmagnetic layer, and in which a direction of magnetization is opposite to that of the second magnetic layer.

15. The device of claim 12, further comprising a semiconductor substrate, a transistor for switching provided on the semiconductor substrate, and a bottom electrode connected to the transistor, wherein:
- the third magnetic layer is provided on the bottom electrode; and
- the stacked layer structure is provided on the third magnetic layer.

16. The device of claim 12, wherein the first and the second magnetic material portions include a same magnetic element.

17. The device of claim 16, wherein a composition ratio of the magnetic element in the second magnetic material portion is less than that of the magnetic element in the first magnetic material portion.

18. The device of claim 17, wherein the second magnetic material portion is $Co_xPt_{1-x}$ ($0<x<1$), and the first magnetic material portion is $Co_yPt_{1-y}$ ($x<y\leq1$).

19. The device of claim 16, wherein each of the first and the second magnetic material portions is an artificial lattice structure in which Co and Pt are alternately stacked, and a ratio of film thickness of Co to Pt (Co/Pt) is less in the second magnetic material portion than in the first magnetic material portion.

20. A method of manufacturing a magnetoresistive memory device comprising:
- forming a stacked layer structure includes a first magnetic layer, a second magnetic layer, and a nonmagnetic layer between the first magnetic layer and the second magnetic layer on a bottom electrode;
- forming a third magnetic layer on the bottom electrode before forming the stacked layer structure, or on the stacked layer structure after forming the stacked layer structure, the third magnetic layer including a first magnetic material portion, which is the layer farther from the stacked layer structure, and a second magnetic material portion, which is the layer closer to the stacked layer structure, saturation magnetization of the second magnetic material portion being smaller than that of the first magnetic material portion; and
- forming a top electrode on the stacked layer structure or on the third magnetic layer on the stacked layer structure.

* * * * *